(12) United States Patent
Chang et al.

(10) Patent No.: US 6,399,996 B1
(45) Date of Patent: Jun. 4, 2002

(54) SCHOTTKY DIODE HAVING INCREASED ACTIVE SURFACE AREA AND METHOD OF FABRICATION

(75) Inventors: Paul Chang, Saratoga; Geeng-Chuan Chern, Cupertino; Wayne Y. W. Hsueh, San Jose; Vladimir Rodov, Redondo Beach, all of CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/620,074

(22) Filed: Jul. 20, 2000

Related U.S. Application Data

(63) Continuation-in-part of application No. 09/544,730, filed on Apr. 6, 2000, and a continuation-in-part of application No. 09/283,537, filed on Apr. 1, 1999, now Pat. No. 6,331,445.

(51) Int. Cl.[7] .................. H01L 77/095; H01L 29/47; H01L 29/812; H01L 31/07; H01L 31/108
(52) U.S. Cl. ................. 257/484; 257/471; 257/622
(58) Field of Search ................. 257/471, 483, 257/484, 622, 623, 624

(56) References Cited

U.S. PATENT DOCUMENTS

| 4,713,358 A | 12/1987 | Bulat et al. |
| 4,926,233 A | 5/1990 | Hutter |
| 4,982,260 A | 1/1991 | Chang et al. |
| 5,262,669 A | * 11/1993 | Wakatabe et al. ........... 257/483 |
| 5,612,232 A | 3/1997 | Thero et al. |
| 5,696,025 A | * 12/1997 | Violette et al. ............. 437/175 |
| 6,232,165 B1 | 5/2001 | Wong |

FOREIGN PATENT DOCUMENTS

| JP | 02000031505a | * 1/2000 | ......... H01L/29/872 |

* cited by examiner

Primary Examiner—Amir Zarabian
Assistant Examiner—Brad Smith
(74) Attorney, Agent, or Firm—Townsend and Townsend and Crew LLP; Henry K. Woodward

(57) ABSTRACT

A Schottky diode comprises a semiconductor body of one conductivity type, the semiconductor body having a grooved surface, and a metal layer on the grooved surface and forming a Schottky junction with the semiconductor body. The semiconductor body preferably includes a silicon substrate with the grooved surface being on a device region defined by a guard ring of a conductivity type opposite to the conductivity type of the semiconductor body.

19 Claims, 5 Drawing Sheets

SCHOTTKY DIODE HAVING INCREASED ACTIVE SURFACE AREA AND METHOD OF FABRICATION

CROSS-REFERENCES TO RELATED APPLICATION

This application is a continuation-in-part of pending application Ser. No. 09/283,537 filed Apr. 1, 1999 for "Power Rectifier Device", U.S. Pat. No. 6,331,445 the description of which is incorporated herein by reference and a continuation-in-part of pending application Ser. No. 09/544,730 filed Apr. 6, 2000 for "Method of Fabricating Power Rectifier Device To Vary Operating Parameters and Resulting Device", the description of which is incorporated by reference.

BACKGROUND OF THE INVENTION

This invention relates generally to power semiconductor devices, and more particularly the invention relates to a Schottky diode device and a method of making same.

Power semiconductor rectifiers have a variety of applications including use in power supplies and power converters. Heretofore, Schottky diodes have been used in these applications. A Schottky diode is characterized by a low turn-on voltage, fast turnoff, and nonconductance when the diode is reverse biased. To create a Schottky diode a metal-silicon barrier must be formed. In order to obtain the proper characteristics for the Schottky diode, the barrier metal is likely different than the metal used in other process steps such as metal ohmic contacts.

Copending application Ser. No. 09/283,537, supra, discloses a vertical semiconductor power rectifier device which employs a large number of parallel connected cells, each comprising a MOSFET structure with a gate-to-drain short via common metallization and an associated Schottky diode. This provides a low Vf path through the channel regions of the MOSFET cells to the source region on the other side of the device. The method of manufacturing the rectifier device provides highly repeatable device characteristics at reduced manufacturing costs.

The present invention is directed to an improved method of manufacturing a Schottky rectifier device and the resulting structure.

SUMMARY OF THE INVENTION

In accordance with the invention, the effective surface area of a Schottky diode is increased by providing a trenched surface on which Schottky material is deposited. The resulting structure has increased current capacity for semiconductor chip area.

In accordance with the method of fabricating the Schottky diode, a guard ring is formed around a device region in a semiconductor chip surface. The guard ring has conductivity type opposite to that of the chip body. Using photoresist masking and etching, a plurality of trenches are etched in the surface of the device region, thereby effectively increasing the active surface area in the device region. A Schottky metal is then deposited over the device region in the trenches, and electrode material is deposited to form top and bottom electrodes for the Schottky diode.

The invention and objections and features thereof will be more readily apparent from the following detailed description and dependent claims when taken with the drawing.

DETAILED DESCRIPTION OF THE ILLUSTRATIVE EMBODIMENTS

Figure 1:
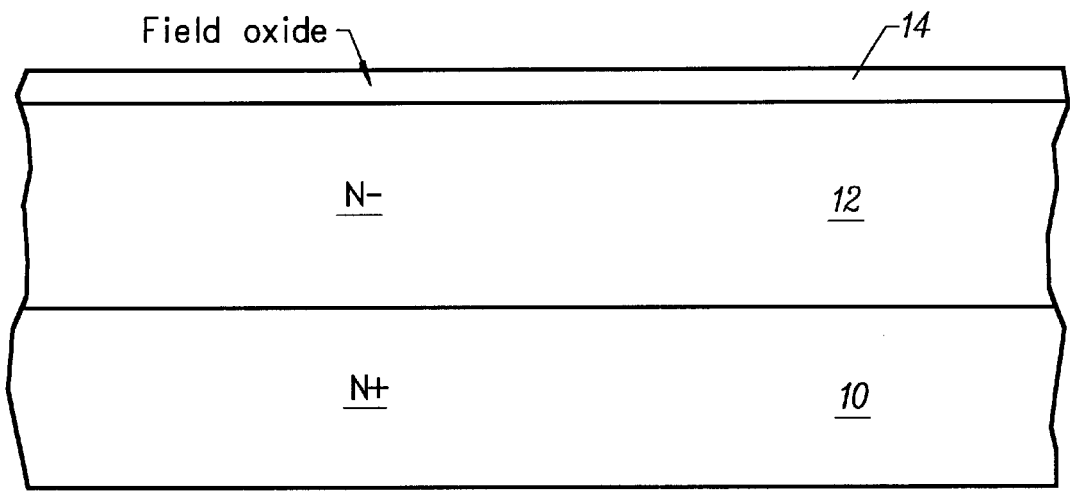
FIGS. 1–8 are section views illustrating steps in fabricating a Schottky diode in accordance with one embodiment of the invention.

FIGS. 1–8 are section views illustrating process steps in fabricating a Schottky diode in accordance with one embodiment of the present invention. In FIG. 1 an N+ silicon substrate 10 has an N− epitaxial silicon layer 12 thereon with layer 12 having a conductivity of about 0.1–10 ohm cm. A field oxide 14 is grown or deposited on the surface of epitaxial layer 12 to a thickness of 300–1000 nm.

Figure 2:
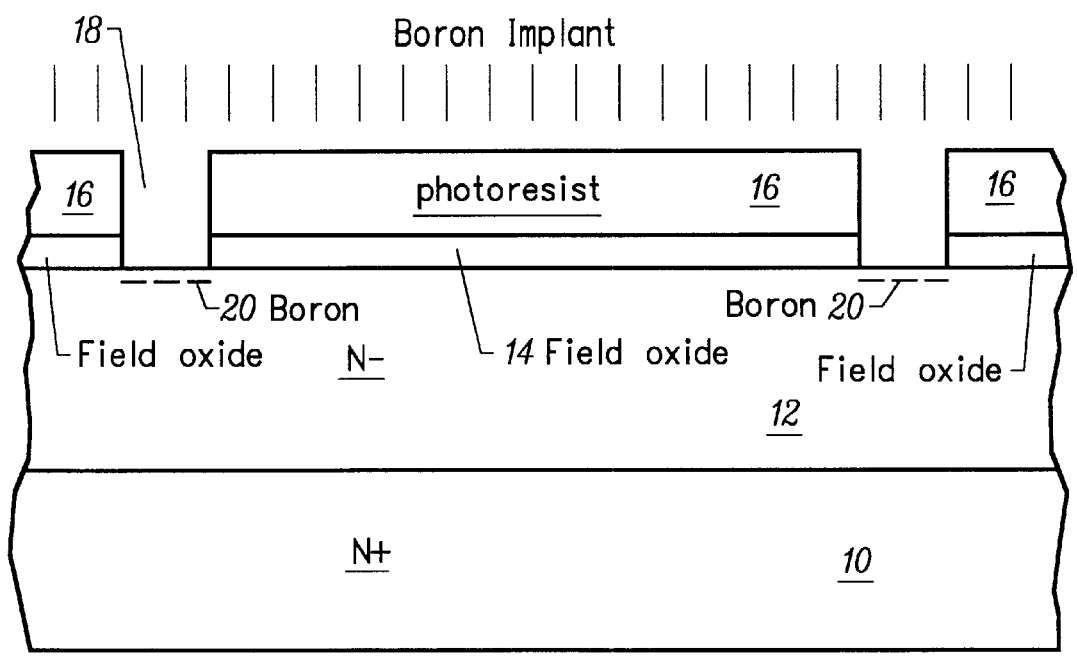

In FIG. 2 a photoresist pattern 16 is formed over field oxide 14 with openings through the photoresist at 18 for the removal of exposed field oxide and implantation of boron or other P-type dopant for use in fabricating a guard ring around a device region. Boron is implanted at 20 to a concentration of about $10^{11}$–$10^{14}$/cm$^2$. The boron implant can be after photoresist removal.

Figure 3:
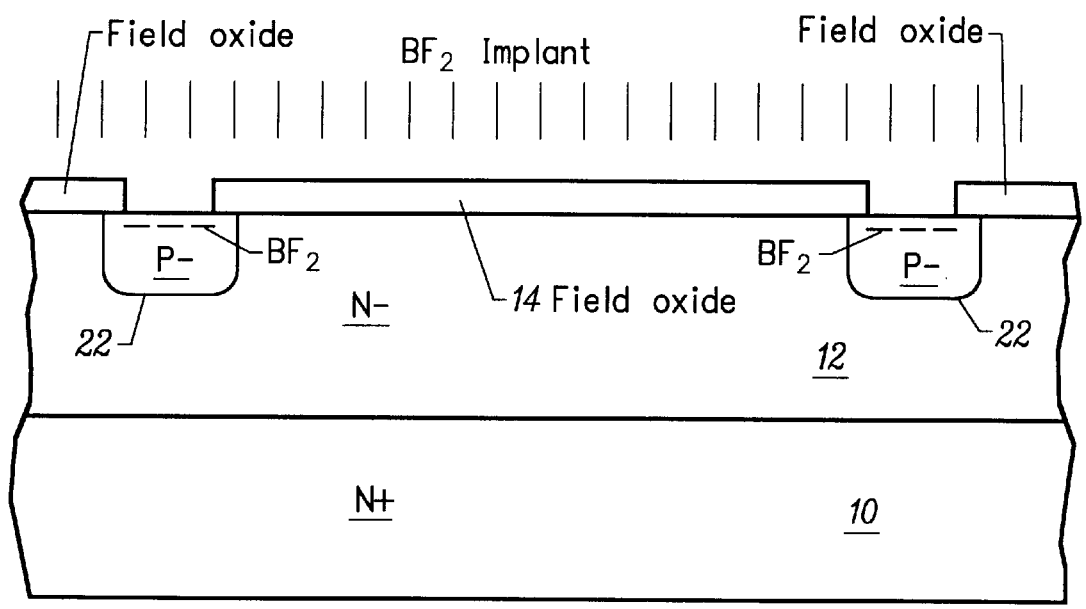

In FIG. 3 the photoresist 16 is removed and the body is heated for boron drive-in in forming deep P-regions 22 which are the guard ring surrounding a device region under field oxide 14. An additional boron (BF$_2$) implant is made for high surface concentration to form good ohmic contacts to the guard ring. Rapid thermal annealing is employed to activate the BF$_2$ dopant.

Figure 4:
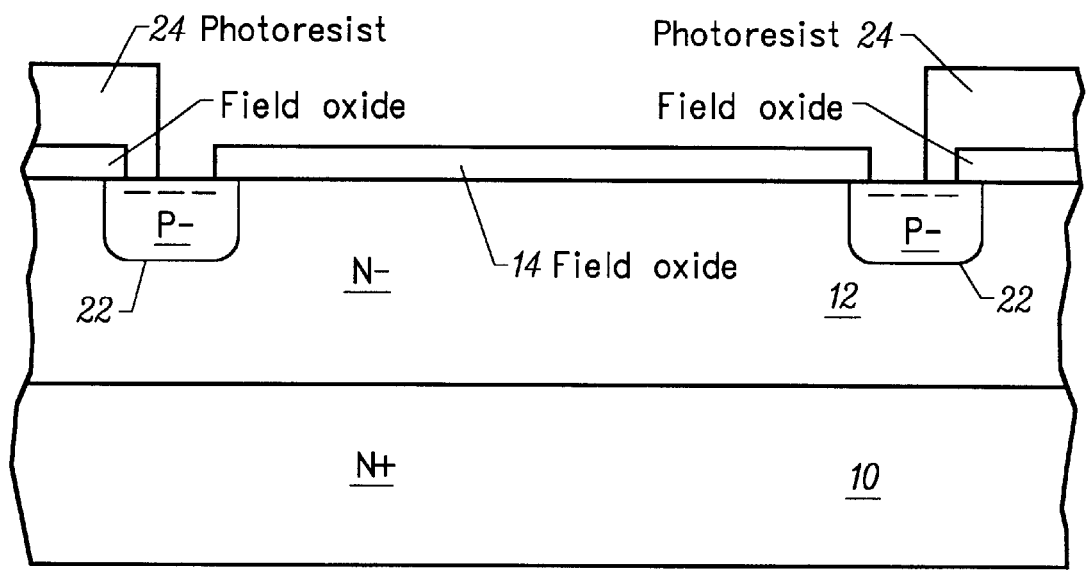
Figure 5:
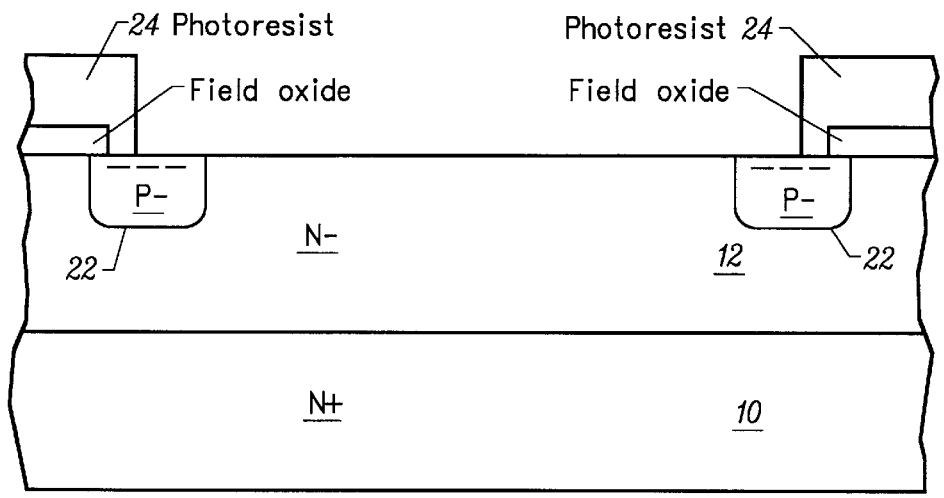

In FIG. 4 a second photoresist mask pattern 24 is used to expose the active device region so that the overlying field oxide 14 can be later removed, as shown in FIG. 5 in which a suitable oxide etchant such as HF solution is employed.

Figure 6:
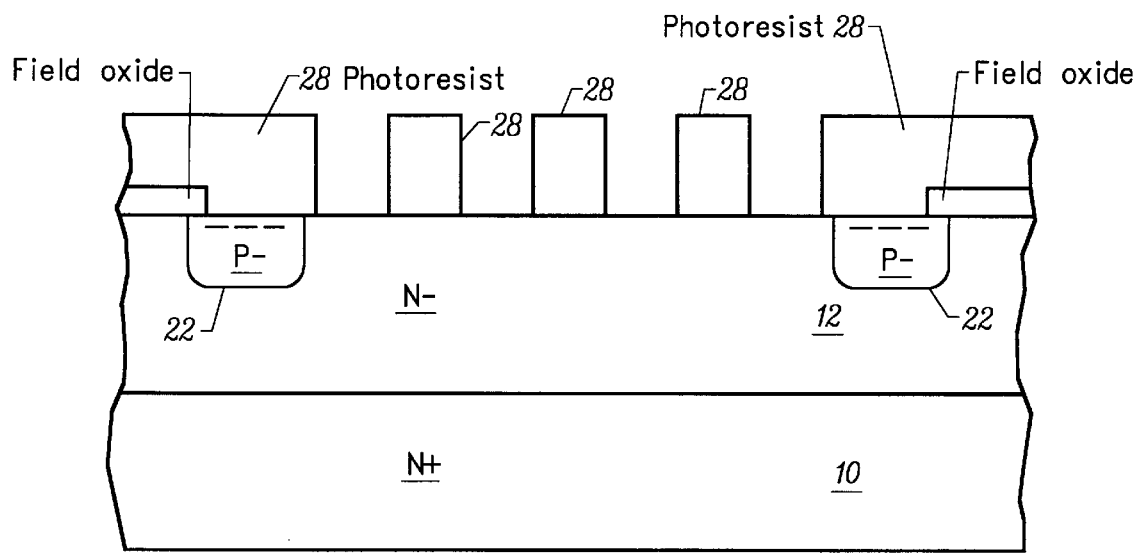
Figure 7:
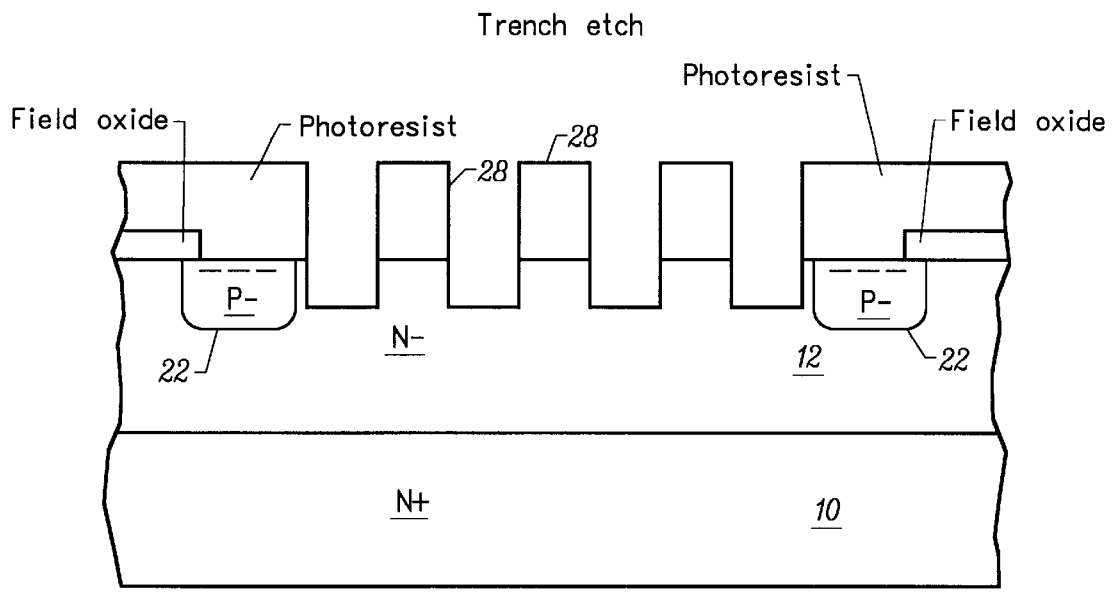

Thereafter, in FIG. 6 a third photoresist pattern 28 is formed over the surface of the active region to define trenches in the surface of the active region by etching as illustrated in FIG. 7. A plasma or reactive ion etch can be employed to form the trenches with either vertical or sloped sidewalls.

Figure 8:
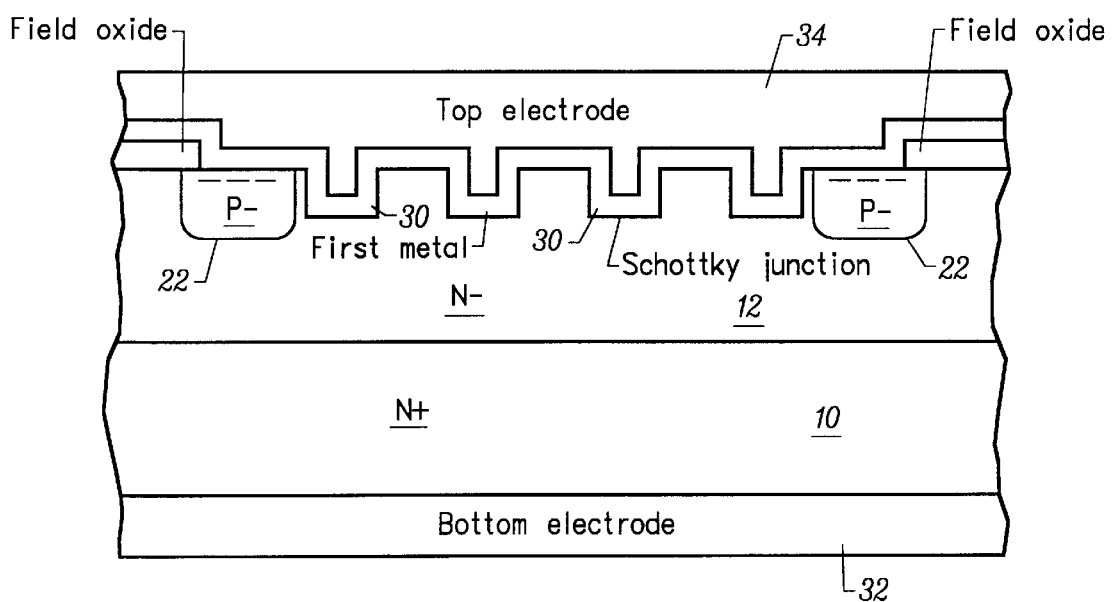

Photoresist pattern 28 is then removed and a Schottky metal 30 is deposited over the surface of the active region in the trenches as shown in FIG. 8. The Schottky metal may comprise molybdenum, aluminum, platinum or other known material for forming Schottky junctions with silicon such as refractory metals and silicides thereof. Finally, a bottom electrode 32 and a top electrode 34 are deposited for making contact to the finished Schottky diode. The contact material can be titanium, titanium nitride, nickel, silver, gold, copper, or other suitable material and combinations thereof.

Figure 9:
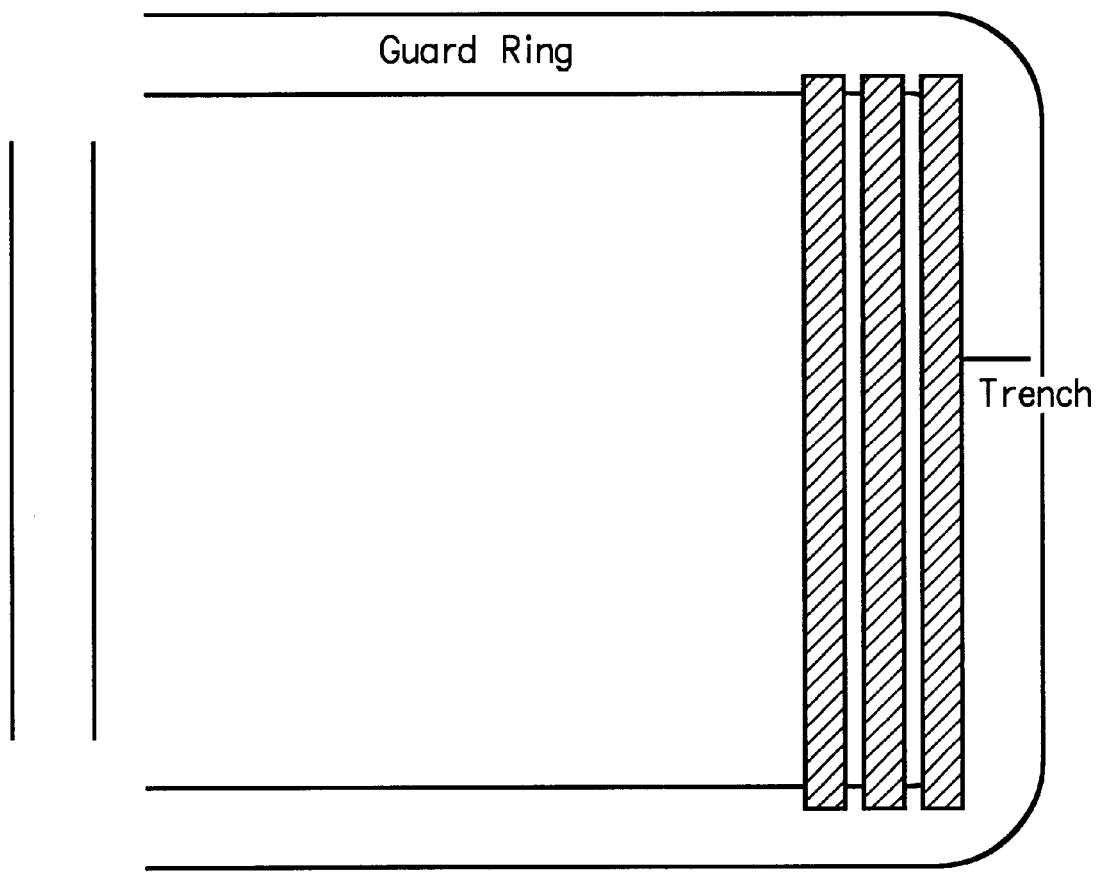
FIG. 9 is a plan view of the resulting Schottky diode using the process of FIGS. 1–8.

FIG. 9 is a plan view illustrating the top of the completed Schottky diode. The trenched surface in the active region effectively increases the surface area of the Schottky diode and thus increases current density and current carrying capacity for unit surface area of the semiconductor device.

While the invention has been described with reference to specific embodiments, the description is illustrative of the invention and is not to be construed as limiting the invention, various modifications and applications may occur to those skilled in the art without departing from the true spirit and scope of the invention as defined by the appended claims.

What is claimed is:

1. A Schottky diode having increased surface area and forward current capacity comprising:
   a) a semiconductor body of one conductivity type and having a major surface,
   b) a guard ring of opposite conductivity type formed in the major surface of second conductivity type and surrounding a device region, c) a plurality of trenches in the major surface within the device region, and d) a metal overlying the device region and in the plurality of trenches forming a continuous Schottky junction with the semiconductor body within the guard ring and uninterrupted by P-N junctions.

2. The Schottky diode of claim 1 wherein the semiconductor body is silicon.

3. The Schottky diode of claim 2 wherein the semiconductor body comprises a substrate and an epitaxial layer, the epitaxial layer being of N-conductivity.

4. A Schottky diode comprising:

a) a silicon semiconductor body of one conductivity type and having a major surface, the silicon semiconductor body comprising a substrate and an epitaxial layer, the epitaxial layer being of N-conductivity;

b) a guard ring of P-type conductivity formed in the major surface of second conductivity type and surrounding a device region, c) a plurality of trenches in the major surface within the device region, and d) a metal overlying the device region and in the plurality of trenches forming a Schottky junction with the semiconductor body.

5. The Schottky diode of claim 4 wherein the metal overlying the device region is selected from the group consisting of molybdenum, platinum, aluminum, refractory metal and silicides thereof.

6. The Schottky diode of claim 5 and further including contact metal on the bottom of the semiconductor body and on the metal overlying the device region.

7. The Schottky diode of claim 6 wherein the contact metal is selected from the group consisting of Ti, TiN, Ni, Ag, Au, Cu, and combinations thereof.

8. The Schottky diode of claim 4 and further including contact metal on the bottom of the semiconductor body and on the metal overlying the device region.

9. The Schottky diode of claim 8 wherein the contact metal is selected from the group consisting of Ti, TiN, Ni, Ag, Au, Cu, and combinations thereof.

10. A Schottky diode comprising a semiconductor body of one conductivity type, a guard ring of a second conductivity type surrounding a device region, the semiconductor body within the guard ring having a grooved surface, and a metal layer on the grooved surface and forming a continuous Schottky junction with the device region uninterrupted by P-N junctions.

11. The Schottky diode as defined by claim 10 wherein the semiconductor body comprises a silicon substrate and an epitaxial silicon layer of N-conductivity on the substrate, the epitaxial layer having the grooved surface.

12. The Schottky diode as defined by claim 11 wherein the metal layer is selected from the group consisting of molybdenum, platinum, aluminum, refracting metal, silicides thereof, and combinations thereof.

13. The Schottky diode as defined by claim 10 wherein the grooved surface is on a device region of the semiconductor body defined by a guard ring of a second conductivity type surrounding the device region.

14. The semiconductor body of claim 3 wherein the guard ring is P-type conductivity.

15. The semiconductor body of claim 14 wherein the metal overlying the device region is selected from the group consisting of molybdenum, platinum, aluminum, refractory metal and silicides thereof.

16. The semiconductor body of claim 15 and further including contact metal on the bottom of the semiconductor body and on the metal overlying the device region.

17. The semiconductor body of claim 16 wherein the contact metal is selected from the group consisting of Ti, TiN, Ni, Ag, Au, Cu, and combinations thereof.

18. The semiconductor body of claim 1 and further including contact metal on the bottom of the semiconductor body and on the metal overlying the device region.

19. The Schottky diode of claim 18 wherein the contact metal is selected from the group consisting of Ti, TIN, Ni, Ag, Au, Cu. and combinations thereof.

* * * * *

UNITED STATES PATENT AND TRADEMARK OFFICE
CERTIFICATE OF CORRECTION

PATENT NO.    : 6,399,996 B1                                              Page 1 of 1
DATED         : June 4, 2002
INVENTOR(S)   : Paul Chang, Geeng-Chuan Chern, Wayne Y.W. Hsueh and Vladimir Rodov It is certified that error appears in the above-identified patent and that said Letters Patent is hereby corrected as shown below:

<u>Column 4,</u>
Lines 21, 23, 27 and 30, change "semiconductor body" to -- Schottky diode --.
Line 33, change "semiconductor body" to -- Shottky diode --.

Signed and Sealed this

Tenth Day of December, 2002

JAMES E. ROGAN
*Director of the United States Patent and Trademark Office*